(12) United States Patent
Arnold (10) Patent No.: US 7,359,207 B1
(45) Date of Patent: Apr. 15, 2008

(54) LAMINATED PRINTED CIRCUIT BOARD FIXTURE ASSEMBLY AND METHOD

(76) Inventor: Bruce Arnold, 1642 McCullock Blvd., #212, Lake Havasu City, AZ (US) 86403

( * ) Notice: Subject to any disclaimer, the term of this patent is extended or adjusted under 35 U.S.C. 154(b) by 477 days.

(21) Appl. No.: 10/913,654

(22) Filed: Aug. 6, 2004

Related U.S. Application Data (63) Continuation-in-part of application No. 10/081,480, filed on Feb. 20, 2002, now Pat. No. 6,775,146.

(51) Int. Cl.
*H05K 1/00* (2006.01)

(52) U.S. Cl. .................................... 361/748
(58) Field of Classification Search ............... 361/748, 361/58
See application file for complete search history.

(56) References Cited

U.S. PATENT DOCUMENTS

| | | | |
|---|---|---|---|
| 3,970,934 A | 7/1976 | Aksu | 324/158 F |
| 4,739,919 A | 4/1988 | Van Den Brekel et al. | 228/180.1 |
| 5,214,571 A | 5/1993 | Dahlgren et al. | 361/414 |
| 5,454,505 A | 10/1995 | Kearns | 228/39 |
| 5,716,663 A * | 2/1998 | Capote et al. | 156/277 |

* cited by examiner

*Primary Examiner*—Stephen W. Jackson
(74) *Attorney, Agent, or Firm*—Gregory J. Nelson (57) ABSTRACT

A fixture assembly for holding printed circuit boards (PCBAs) during processing such as wave soldering. The fixture assembly consists of multiple plates which are assembled to define protective cavities and recesses for masking components such as surface mounted devices and define apertures so that pass-through leads are exposed at the bottom or secondary side of the bottom plate. An optional weighting member may be used to firmly secure the PCBA during processing. The multi-plate structure is cost effective reducing milling and machining operations normally attendant to the fabrication of a fixture assembly. In another embodiment, a stencil is provided with cut-outs corresponding to protected area on the PCBA. A soluble masking material is applied to the stencil and board prior to wave soldering. The masking material is subsequently rinsed away.

9 Claims, 10 Drawing Sheets

STENCIL WITH CUT OUTS -
THE CUT OUTS MATCH THOSE AREAS OF PCB ASSEMBLY
TO BE COVERED WITH MASKING TYPE MATERIAL

1. THE CUTOUTS IN THE STENCIL ALLOW THE MASKING MATERIAL TO PASS THROUGH THE STENCIL, AND TO BE PRECISELY APPLIED TO THE PCB ASSEMBLY, PROTECTING THE DESIRED AREAS.

LAMINATED PRINTED CIRCUIT BOARD FIXTURE ASSEMBLY AND METHOD

CROSS REFERENCE IS MADE TO RELATED APPLICATION

This application is a continuation-in-part of Ser. No. 10/081,480, filed Feb. 20, 2002 now U.S. Pat. No. 6,775,146, of the same title.

FIELD OF THE INVENTION

The present invention relates to a printed circuit board fixture assembly and more particularly relates to a fixture for temporary securement of a printed circuit board during processing such as during wave soldering. More particularly, the present invention relates to a fixture assembly having multiple plates or substrates for masking a circuit board so that the leads of components are exposed while surface mounted components (SMTs), are protected or masked from the solder. In another embodiment, the invention relates to a mask or stencil which is used to apply a soluble masking material to a surface of a circuit board.

Printed circuit board assemblies (PCBA's) often carry surface mounted technology ("SMT") components referred to as "SMD's" which are mounted and soldered to one or both sides of the board. The same printed circuit board assemblies also may contain plated through hole components (PTH's) on one or both sides of the PCB. Prior to the wave the soldering procedure, it is conventional practice to place a mask of some type over the surface on which soldering of the leads is to occur. The mask has openings which expose one or a plurality of the leads to be soldered. The mask will typically have recesses which receive the surface mounted components on the downwardly disposed surface of the board and shield these components during the wave soldering procedure.

BACKGROUND OF THE INVENTION

Various devices for masking circuit boards during wave soldering may be found in the prior art. U.S. Pat. No. 5,454,505 describes an apparatus for facilitating wave soldering treatment and other handling of circuit components during manufacture. The apparatus has a rigid frame symmetrical about a plane and defining an opening which traverses the frame intermediate a first side and second side. The apparatus further comprises a masking member affixed to the frame defining a plurality of apertures traversing the masking member to the opening in the frame. A holding device maintains the circuit components in an operational location in fixed relation with the masking member with the frame during wave soldering. Areas in the circuit component are substantially in registry with an aperture of the masking member when the circuit component is in the operational location. The walls about the apertures have a ramp for effecting solder flow during wave solder treatment.

U.S. Pat. No. 4,739,919 discloses a soldering mask for soldering the leads of leaded components to a circuit pattern on a surface of the circuit board having surface mounted components already soldered to the circuit pattern on that surface. The mask comprises a flat metal plate having a recess in the top surface with a plate for reception of the circuit board. Cavities in the bottom surface of the recess house the surface mounted components. Openings through the plate from the bottom surface of the recess permit passage of leads and also permit access by the solder to the solder leads of the circuit pattern.

While the above patents and other similar devices in the prior art facilitate masking of circuit boards for wave soldering, there nevertheless exists a need for a fixture which can be economically manufactured without the necessary expensive machining and milling operations. There further exists a need for a more versatile, less expensive fixture having components which can be used with various PCBA's.

SUMMARY OF THE INVENTION

Briefly, the present invention provides a fixture or holding assembly that is assembled from a plurality of individual substrates or plates that have been fabricated to accommodate the requirements of a particular PCBA. The first or top plate is configured having a cut-out to conform to the perimeter of the PCBA and to properly align the PCBA to be processed. An intermediate or middle plate has cutouts of the various sizes and shapes to accommodate various surface mounted devices that are mounted on the surface of the PCBA that will be downwardly disposed during wave soldering. This downwardly disposed surface of the PCBA is typically referred to as the secondary side. The intermediate plate will contain cutouts of various sizes which become protective cavities once the bottom or lower plate is attached to the bottom or secondary side of the intermediate plate. The intermediate plate may also contain apertures of various sizes to accommodate the leads of PTH devices mounted on the upper surface of the PCBA which is typically referred to as the primary side. These cutouts will align and register with similar apertures in the bottom most plate to allow leads to pass through both the intermediate and bottom plates.

The intermediate plate is of the appropriate thickness to accommodate the height of the surface mount and PTH devices mounted on the secondary side so that when the bottom plate is attached, the cut-outs in the intermediate plate define protective cavities and recesses. The bottom plate is secured to the bottom surface of the intermediate plate and has apertures of various shapes that align with similar cut-outs to accommodate the passage of the PTH devices. Since the lower plate defines apertures only for the leads of the PTH devices on the primary side of the PCBA, the addition of the bottom plate shields and protects the bodies of the SMD and PTH devices that are mounted on the secondary side of the PCBA. An additional, optional plate termed a "weighting plate" may also be provided which will hold the PCBA flat against the surface of the intermediate plate. The optional weighting plate has locating holes which registers with alignment pins or posts. The weighting plate has adjustable fasteners inserted to appropriate depths so that the weighting plate applies a downward force against the PCBA through the depending fasteners. Preferably the fasteners are threaded members of nylon or similar material which will contact the PCBA only in unpopulated areas.

BRIEF DESCRIPTION OF THE DRAWINGS

The above and other objects and advantages will become more apparent from the following description, claims and drawings in which:

DETAILED DESCRIPTION OF THE DRAWINGS

Figure 1:
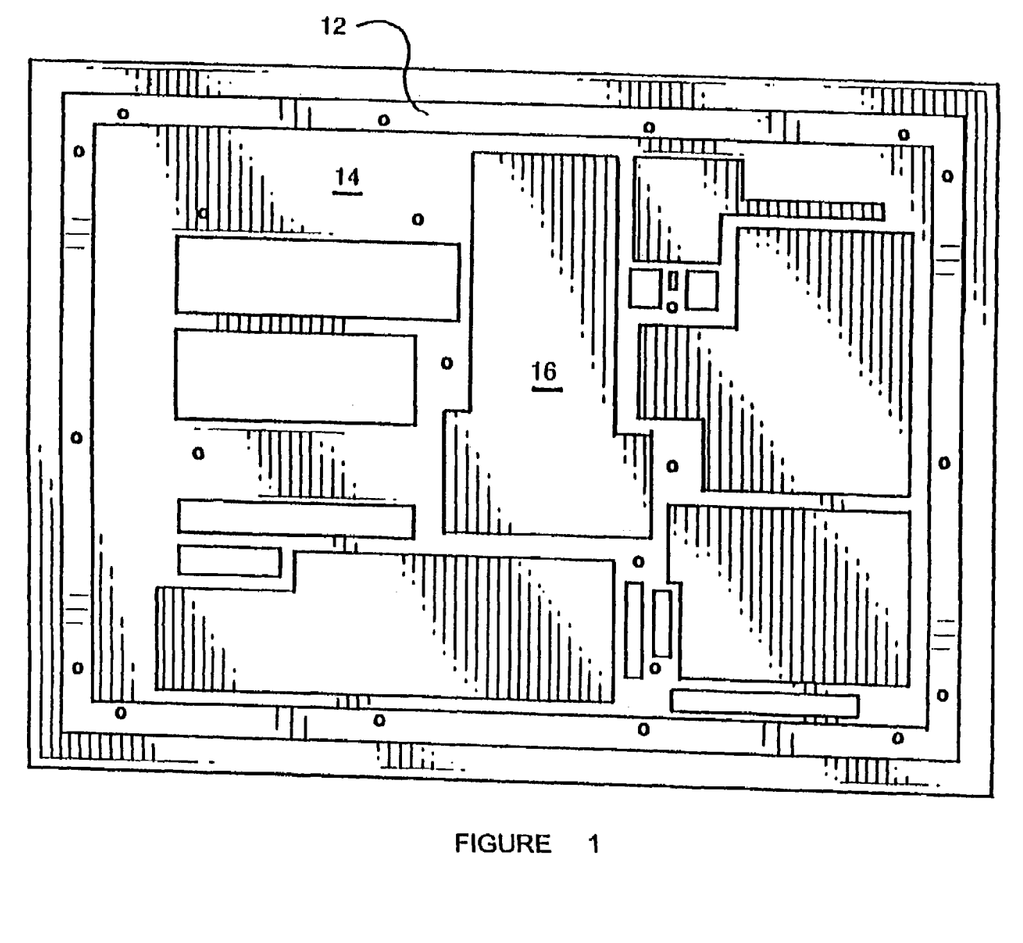
FIG. 1 is a plan view of the multi-plate holding fixture assembly for PCBA's according to the present invention.
Figure 2:
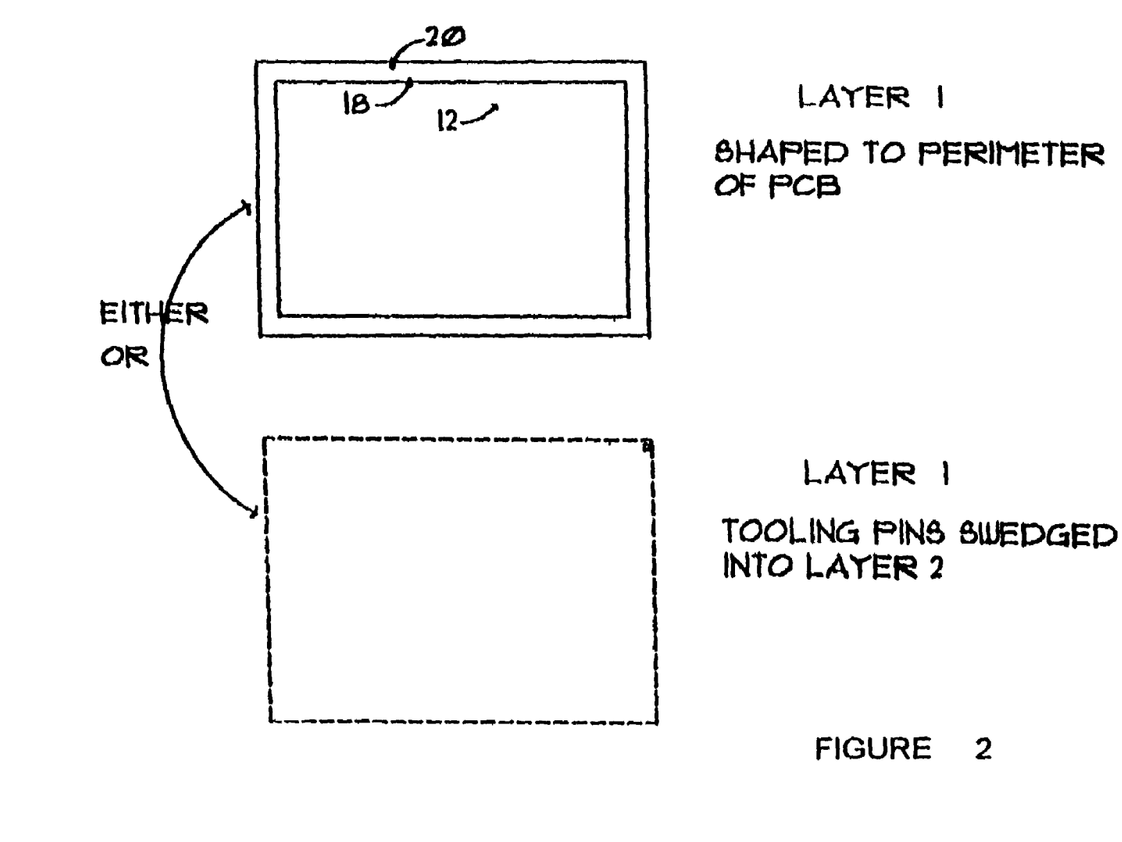
FIG. 2 is a plan view of the uppermost plate of the multi-plate fixture.

Turning now to the drawings, FIGS. 1 to 5 illustrate an embodiment of the fixture assembly of the present invention which is generally indicated by the numeral 10. The fixture consists of an assembly comprised of multiple plates 12, 14, and 16. The upper plate 12 is shown in FIG. 2 and is a frame-like structure having an outer periphery 20 and an inner periphery 18 which defines a cut which is as shown as being generally rectangular for purposes of illustration but may be other shapes. The dimensions and configuration of the plate 12 may vary in accordance with the PCBA which is to be processed. The dimensions of the inner periphery 18 are sized and configured to closely conform to the perimeter of the PCBA and to properly align the PCBA in the fixture. The upper plate 12 can be made of various materials such as titanium, stainless steel or aluminum, however materials such as fiberglass and similar glass-based composite materials are preferred. All of the plates or substrates which make up the fixture may be of the same material or each plate can be made of a different material. Similarly each plate may be fabricated from several lamina joined to the desired thickness. The cut-out 18 in the plate 12 can be formed by any suitable operation such as cutting, by machining, milling, laser cutting or water jet cutting.

Figure 3:
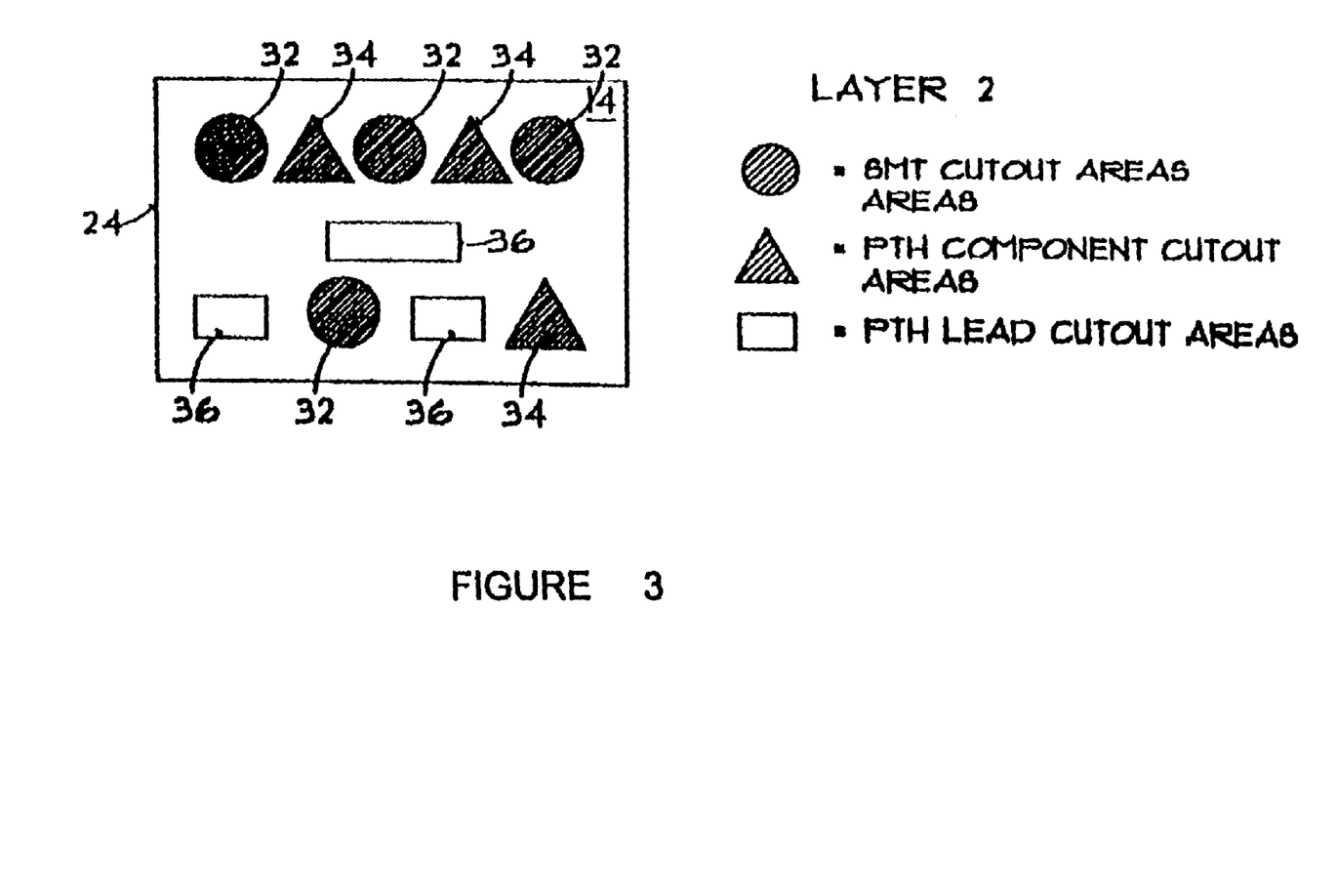
FIG. 3 is a plan view of a representative intermediate plate.
Figure 4:
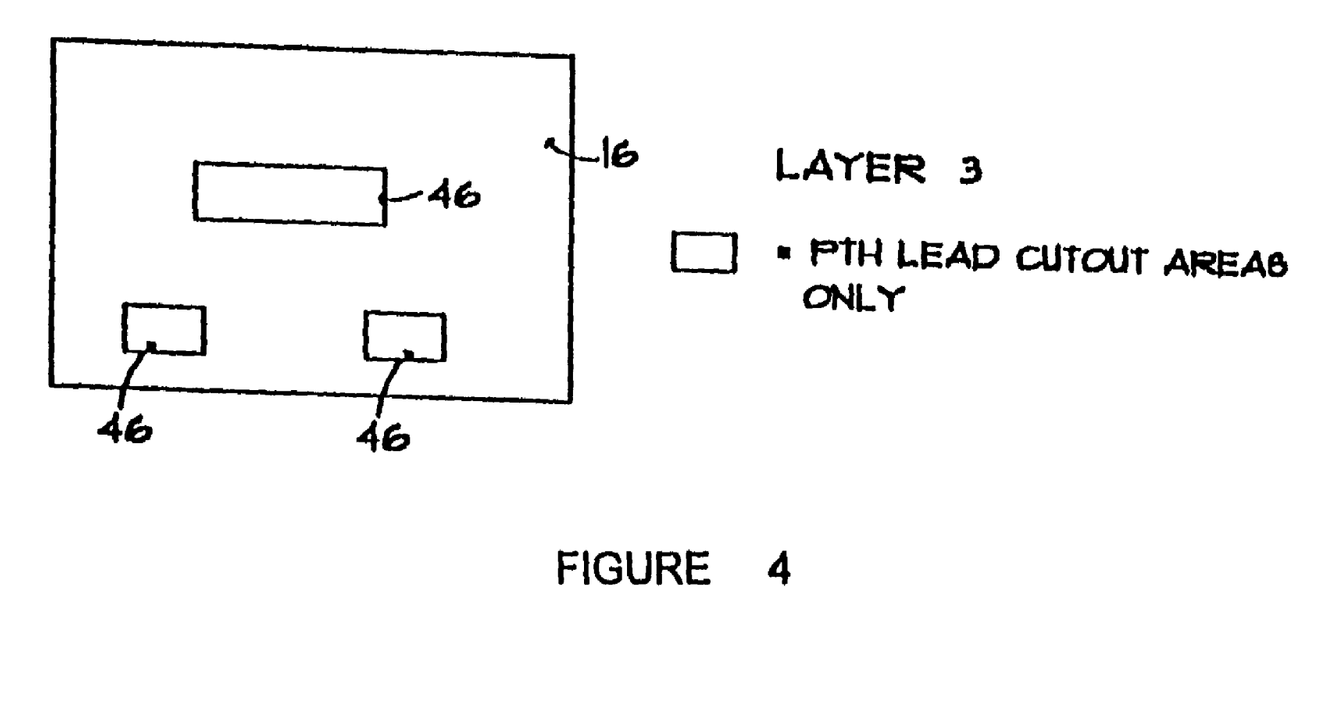
FIG. 4 is a plan view of a representative bottom plate.

The next subjacent or intermediate plate 14 in the assembly is generally indicated by the numeral 14. As seen in FIG. 3, the plate 14 has an outer periphery 24 which conforms to the outer periphery 20 of the upper plate 12. Plate 14 is provided with a plurality of cut-outs indicated as 32, 34 and 36. Cut-outs 32 are sized and shaped to accommodate surface mounted devices that may be mounted on the secondary or lower surface of the PCBA that will be in contact with plate 14. The downwardly disposed surface of the PCBA is typically referred to as secondary bottom side.

Figure 5:
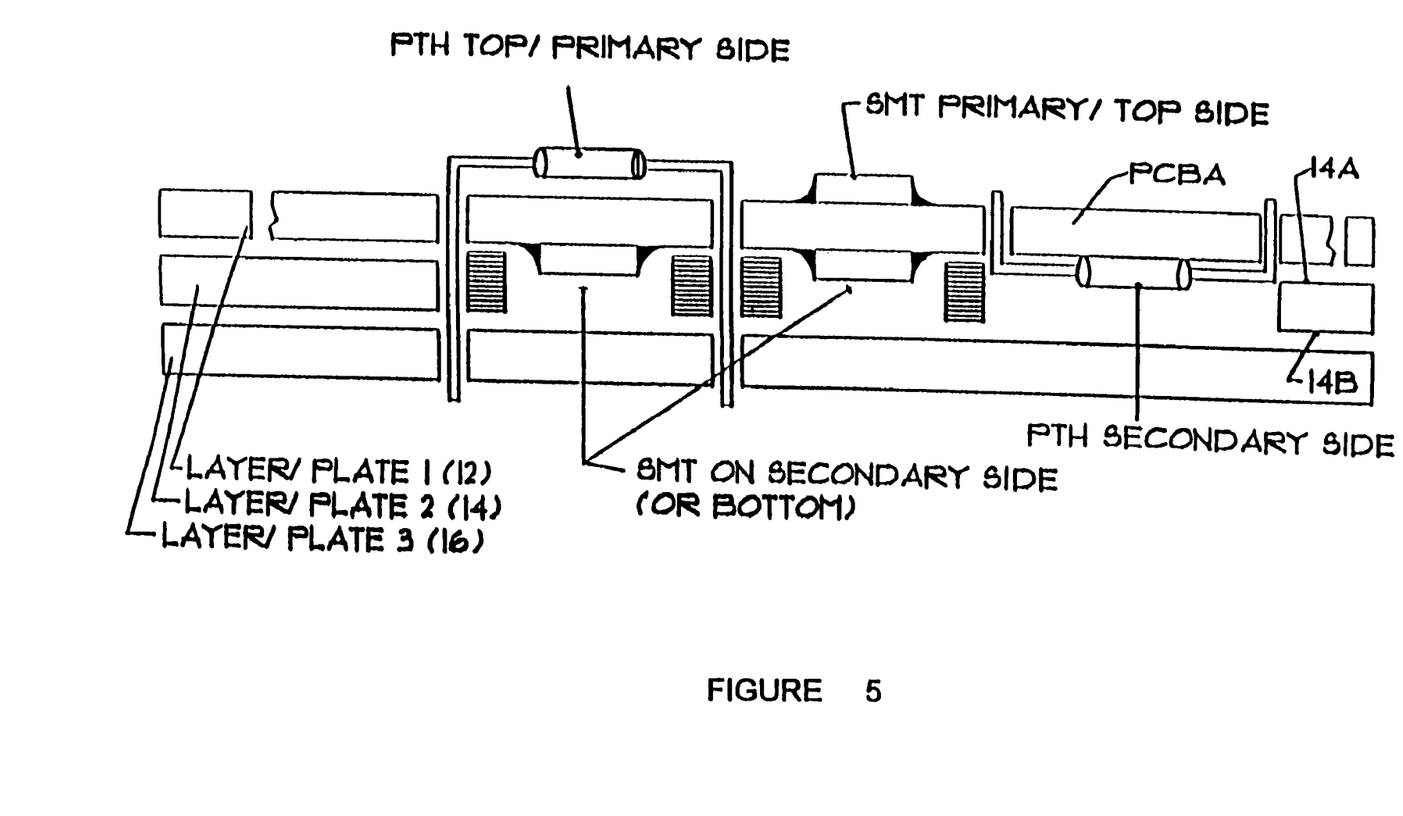
FIG. 5 is a cross-sectional view of a representative PCBA mounted within the fixture assembly ready for processing by a wave soldering process.

The cut-outs 32, shown as round for purposes of this description, may by any geometric shape. As will become apparent hereafter, with the installation of the bottom plate 16, these cut-outs 32 will define protective cavities, as best seen in FIGS. 1 and 5, that will protect the surface mounted devices.

In addition, the plate 20 is provided with a plurality of areas designated by numeral 34, which are configured to receive PTH components on the secondary side of the PCBA to be processed. In addition, a plurality of cut-outs 36, which are various sizes and shapes to accommodate the leads of PTH devices mounted on the top or primary side of the PCBA. These cut-outs or apertures 36 will align or register with identical or similarly shaped apertures 46 in the bottom plate 16 to allow the leads to pass through both the intermediate and bottom plates for soldering. The shape of these apertures 36, 46 may conform to the shape of only a single lead or may be various shapes to configure to extend around a plurality or group of adjacent leads.

Figure 7:
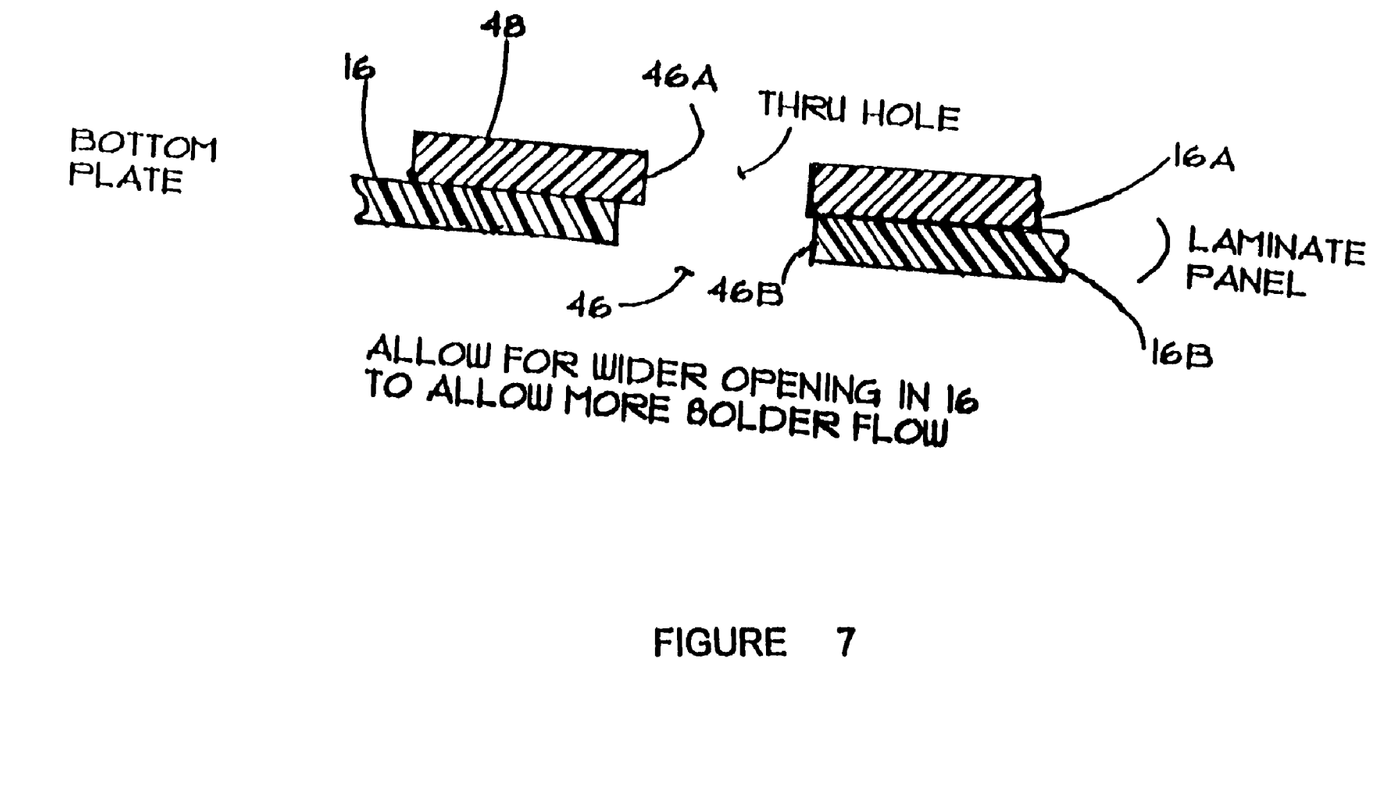
FIG. 7 is a cross-sectional view showing an alternate embodiment of the lower plate having a laminate construction to facilitate solder access to the component leads.

Plate 16 is the lower most plate and is secured to the intermediate plate mechanically or by adhesive or bonding methods. As mentioned above, the lower plate 16 has apertures of various sizes and shapes 46 that align with the cut-outs in plate 14 to accommodate the passage of PTH leads. While the through hole cut-outs or apertures in the lower plate 16 may be identical in size and shape to those of the intermediate plate 14, it is preferred that they be configured as shown in detail in FIG. 1 to facilitate the flow of solder to the leads during the wave soldering operation. The lower plate 16 may be a laminate structure fabricated from several thinner plates 16A, 16B, as seen in FIG. 7 with the aperture 46B in plate 16B being larger than aperture 46A in the plate 16A so the result is a through hole 46 of upwardly decreasing size. The plates are assembled as a unitary structure as shown in FIG. 1. The individual plates may be of the same or similar material. The plates 16A, 16B may be fastened or secured together by any conventional means such as use of stainless steel fasteners 48.

A significant advantage of the multi-plate structure of the fixture assembly is that machining, milling or cutting out the various areas is facilitated and more easily accomplished since in each substrate the cut-outs extend entirely through the individual plate. It is not necessary for complicated milling or CNC operations be performed in order to form cavities or recesses of different depths. Further, the individual components may be used in connection with the processing of PCBAs of various configuration. For example, the uppermost plate 20 might be used in connection with PCBAs having various components if the PCBAs have the same outer dimensional configuration. In this case, it will be necessary only to fabricate the intermediate and the bottom plates resulting in a savings economy of manufacture. The assembly and disassembly of a fixture is facilitated by use of fasteners such as screws. Further each plate may itself be a composite structure of several laminates. For example, if plate 14 is required to be 0.060" in thickness, two 0.030" thick plates may be secured together to achieve the desired thickness. In some instances processing PCBAs having only through holes, the intermediate plate 14 can be eliminated and, in which case, the fixture assembly would comprise only upper plate 12 and the lower plate 16 to mask the through holes.

Figure 6:
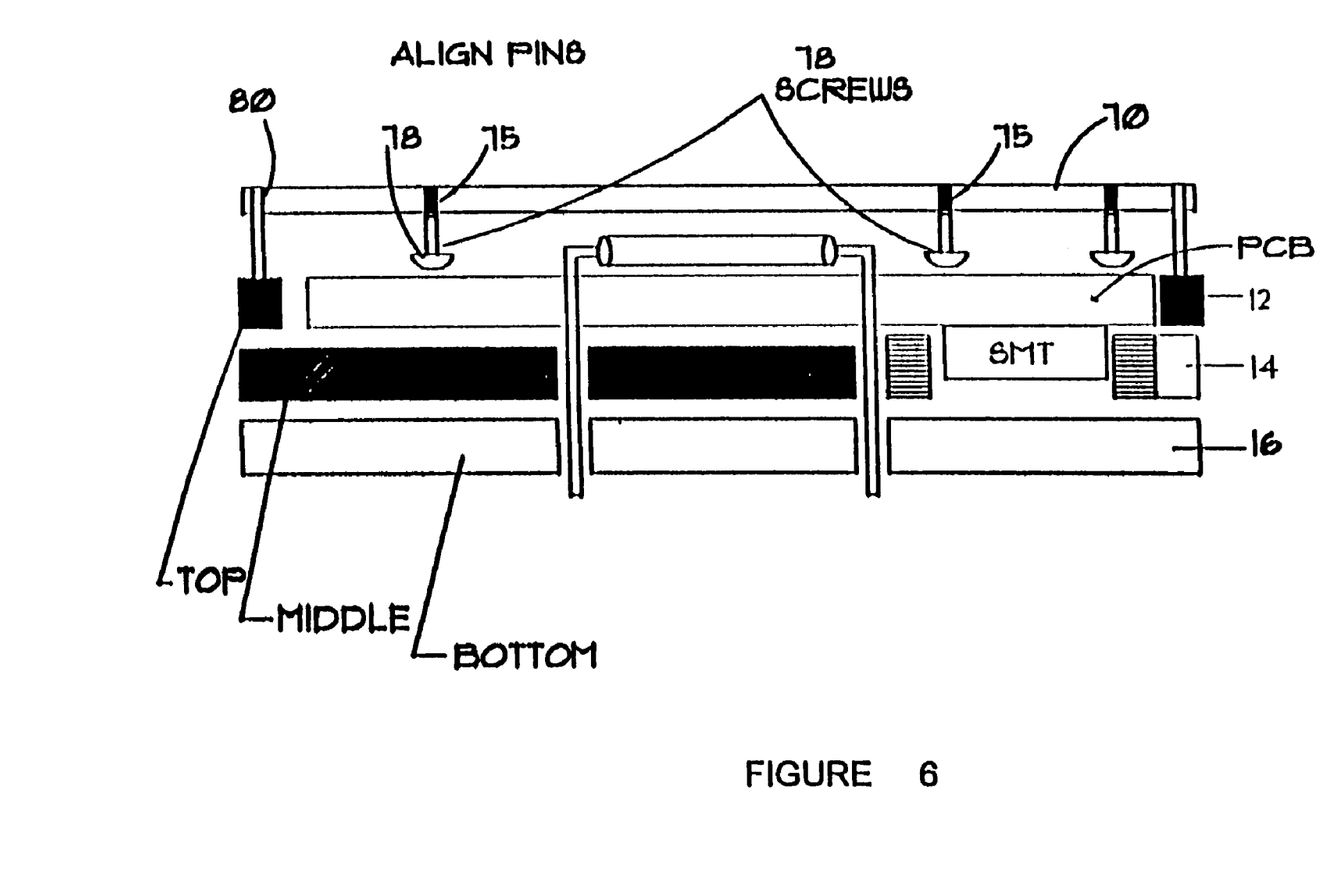
FIG. 6 is a cross-sectional view of a representative fixture including the addition of a weighting plate for maintaining the PCBA in a flat position within the fixture.

It is important that during the wave soldering operation that the PCBA be maintained in a firm, planar condition so that the leads are properly soldered and that solder leakage through the lower plate does not occur. Referring to FIG. 6, it may be desirable in some applications to utilize a weighting plate which is designated by the numeral 70. The plate 70 will serve as a means to hold the PCBA flat against the intermediate plate 14. The plate 70 will be received over pins 80 that project upwardly from the upper plate 12. The weighting plate 70 is provided with a plurality of threaded holes 75 which correspond in location to unpopulated flat areas in the PCBA to be processed. At least selected of the threaded holes 75 will receive a threaded spacer 78, such as nylon screws, which can be adjusted to the required length extending from the lower surface of the plate 70. The plate, which serves as a weighting plate, is preferably suitably of a heavy material such as steel or stainless steel. The plate 70 is positioned over the alignment posts 80 and the spacers 78 are adjusted to contact the upper surface of the PCBA applying downward pressure to maintain the PCBA in a flat planar position firmly against the upper surface of the intermediate plate.

Figure 8:
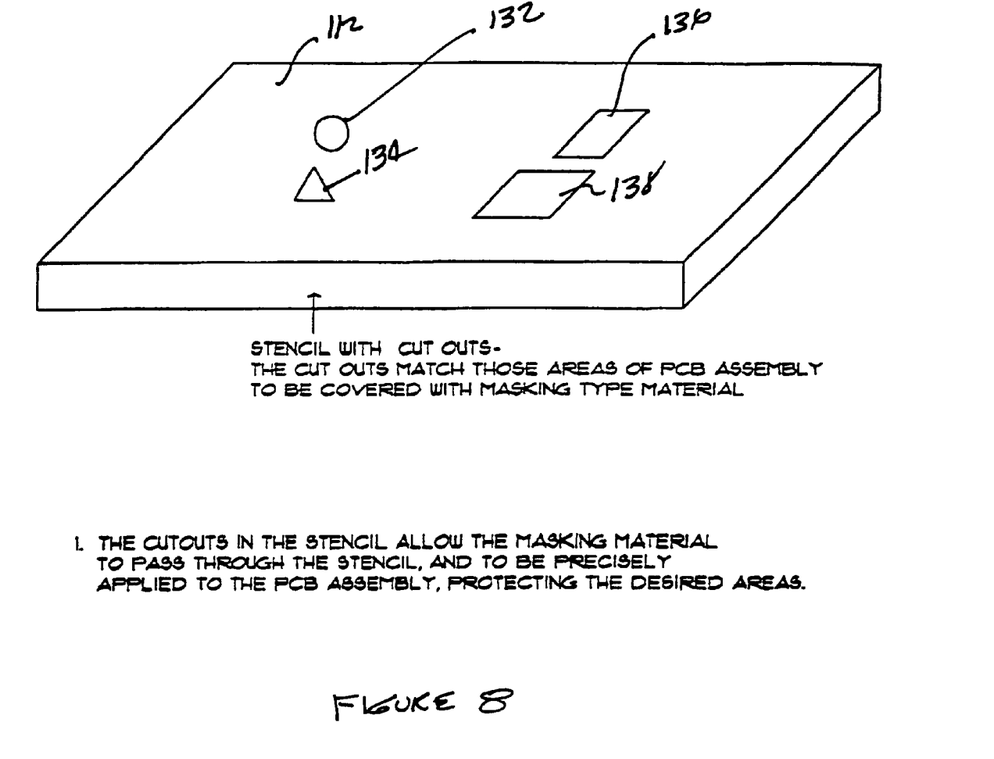
FIG. 8 is a perspective view of a stencil used in processing PCBA's according to an alternate embodiment of the present invention.
Figure 9:
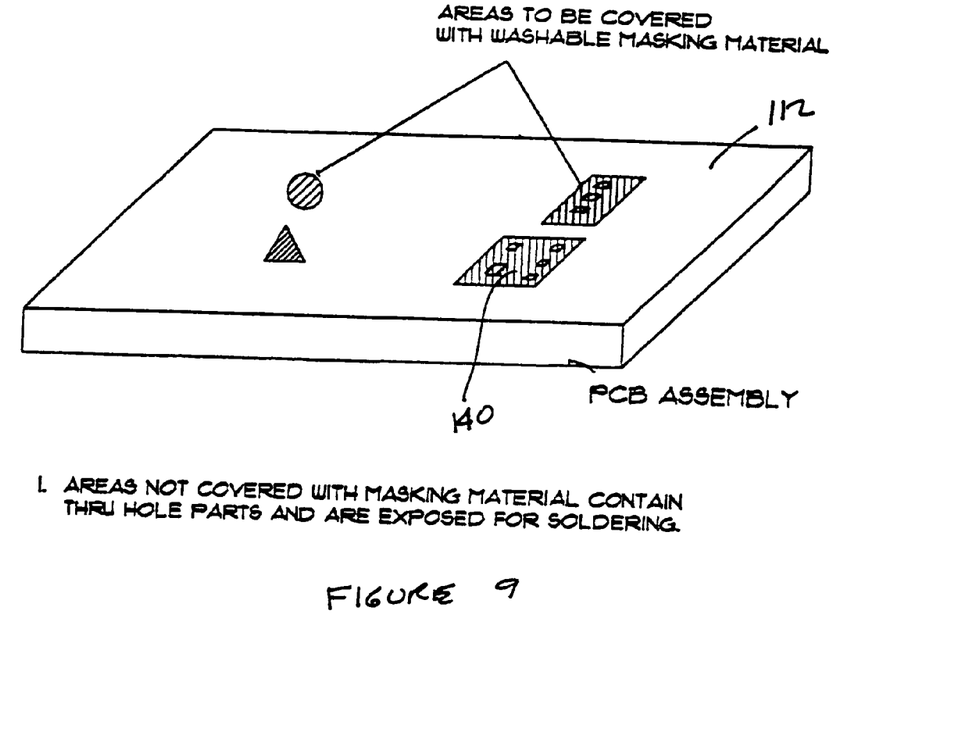
FIG. 9 is a perspective view of a PCBA with surface areas protected by a washable masking material.
Figure 10:
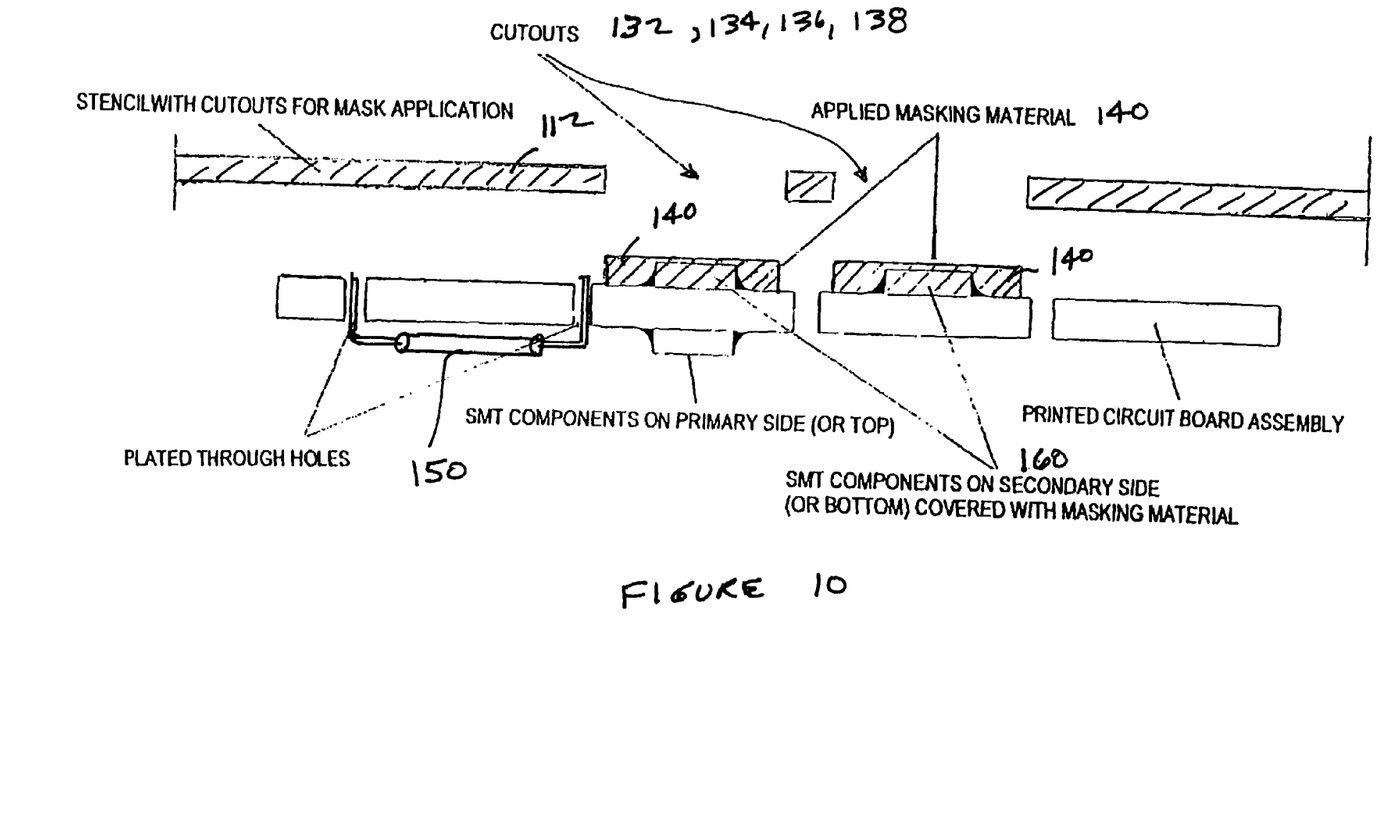
FIG. 10 is a cross-sectional view of a representative PCBA prepared for wave soldering in accordance with the stencil of FIG. 8.

FIGS. 8, 9 and 10 illustrate an alternate embodiment of the present invention in which a stencil is used to mask off areas of PCBA so a masking material can be selectively and temporarily applied to protect the PCBA area during subsequent processing such as wave soldering.

In FIG. 8 a stencil 112 shown as a plate of suitable material such as steel, plastic, aluminum or other material is shown being sized and dimensioned to conform to the PCBA being processed. A plurality of cut-outs 132, 134, 136 and 138 are provided and extend through the plate 112. The cut-outs are located and sized to conform to the position and size of components on the PCBA that are to be protected during subsequent processing such as wave soldering. Typical areas represent the location of SMT's on the secondary or bottom side of the PCBA.

The stencil having the appropriate apertures or cut-outs 132, 134, 136 and 138 are positioned against a surface of the PCBA and held securely by a clamp or holding device.

The next step involves applying a masking material 140 to the PCBA to protect areas where SMD's are located. The mask material is a liquid or paste which may be applied by brush, spray or roller to penetrate the cut-outs and cover the protected areas on the board. Any excess material may be removed by a doctor blade or squeegee.

The masking material may be a water-soluble material such as Kester TC564-1 or Chemtronics Chemask W, as well as other comparable masking materials known to those in the art. The applied masking material is allowed to cure or set-up either by air drying, oven drying or, in some cases, exposure to ultra violet light.

Once the masking material is applied, the stencil plate 112 is then removed and the PCBA is as seen in FIG. 10 ready for subsequent processing such as wave soldering to solder component leads in the through-holes. The components are represented by PTH 150 and SMD 160. SMD 160 is protected by the masking material 140. Upon completion of wave soldering, the board is washed and the washing process will remove the mask, it being preferred the masking material 140 is water-soluble.

The use of a stencil permits the mask material to pass through the stencil and be precisely applied to the PCBA, protecting the desired areas.

It will be obvious to those skilled in the art to make various changes, alterations and modifications to the invention described herein. To the extent such changes, alterations and modifications do not depart from the spirit and scope of the appended claims. They are intended to be encompassed therein.

I claim:

1. A method of processing a printed circuit board assembly (PCBA) having opposed primary and secondary surfaces and having at least one surface mounted component on said secondary surface of the PCBA with through-holes in the PCBA, said method comprising:
   (a) providing a generally planar stencil having at least one cut-out located and dimensioned to define a protected area on said secondary surface of the PCBA, said protected area conforming to the size and location of said surface-mounted component;
   (b) positioning the stencil against the secondary surface of the PCBA with the cut-out aligned with the surface-mounted component;
   (c) applying a masking material to the stencil in the area of the cut-out to cause the masking material to cover the surface-mounted component and to adhere to the secondary surface of the PCBA in said protected area;
   (d) curing the masking material;
   (e) removing the stencil from the PCBA;
   (f) subjecting the PCBA to wave soldering with the secondary surface exposed to the solder to apply solder to the through-holes; and
   (g) removing the masking material.

2. The method of claim 1 wherein the masking material is applied by spraying.

3. The method of claim 1 wherein the masking material is applied by roller.

4. The method of claim 1 wherein the masking material is applied by brushing.

5. The method of claim 1 wherein the masking material is water-soluble.

6. The method of claim 1 wherein curing is accomplished by air drying.

7. The method of claim 1 where curing is accomplished by oven drying.

8. The method of claim 1 wherein curing is accomplished by exposure to radiation.

9. The method of claim 1 wherein said cut-out in the stencil is created by fabrication techniques selected from the group consisting of machining, milling, laser cutting and water jet cutting.

* * * * *